US005789937A

United States Patent [19]
Cao et al.

[11] Patent Number: 5,789,937
[45] Date of Patent: Aug. 4, 1998

[54] IMPEDENCE SELF-ADJUSTING DRIVER CIRCUIT

[75] Inventors: Tai Any Cao; Satyajit Dutta, both of Austin; Thai Quoc Nguyen, Plano, all of Tex.; Pee-Keong Or, Hillsboro, Oreg.; Thanh Doan Trinh; Lloyd Andre Walls, both of Austin, Tex.

[73] Assignee: International Business Machines Corporation, Armonk, N.Y.

[21] Appl. No.: 702,406

[22] Filed: Aug. 14, 1996

[51] Int. Cl.⁶ .................................. H03K 19/0185
[52] U.S. Cl. .................... 326/30; 326/86; 326/87
[58] Field of Search ...................... 326/21, 30, 33, 326/82, 83, 86

[56] References Cited

U.S. PATENT DOCUMENTS

| | | | |
|---|---|---|---|
| 4,719,369 | 1/1988 | Asano et al. | 326/30 |
| 5,134,311 | 7/1992 | Biber et al. | |
| 5,220,208 | 6/1993 | Schenck | 326/27 |
| 5,294,845 | 3/1994 | McMahan et al. | 326/30 |
| 5,448,182 | 9/1995 | Countryman et al. | 326/83 |
| 5,578,939 | 11/1996 | Beers et al. | 326/82 X |
| 5,596,285 | 1/1997 | Marbot et al. | 326/83 X |
| 5,621,335 | 4/1997 | Andresen | 326/87 |
| 5,666,078 | 9/1997 | Lamphier et al. | 326/30 X |

*Primary Examiner*—Jon Santamauro
*Attorney, Agent, or Firm*—Kelly K. Kordzik; Winstead Sechrest & Minick P.C.; Anthony V.S. England

[57] ABSTRACT

A driver circuit including of one or more fingers, or parallel driver circuits, senses for an overshoot or an undershoot condition of the signal transmitted onto a transmission line coupled to the driver circuit and compensates for such an overshoot or an undershoot by temporarily turning off the offending transition portion of the driver circuit, or finger portion. This is accomplished by turning off the transistor applying one of the two supply voltages coupled to the output transmission line. Effectively, the compensation circuitry within the driver circuit more closely matches the output impedance of the driver circuit to the impedance on the driven transmission line.

11 Claims, 6 Drawing Sheets

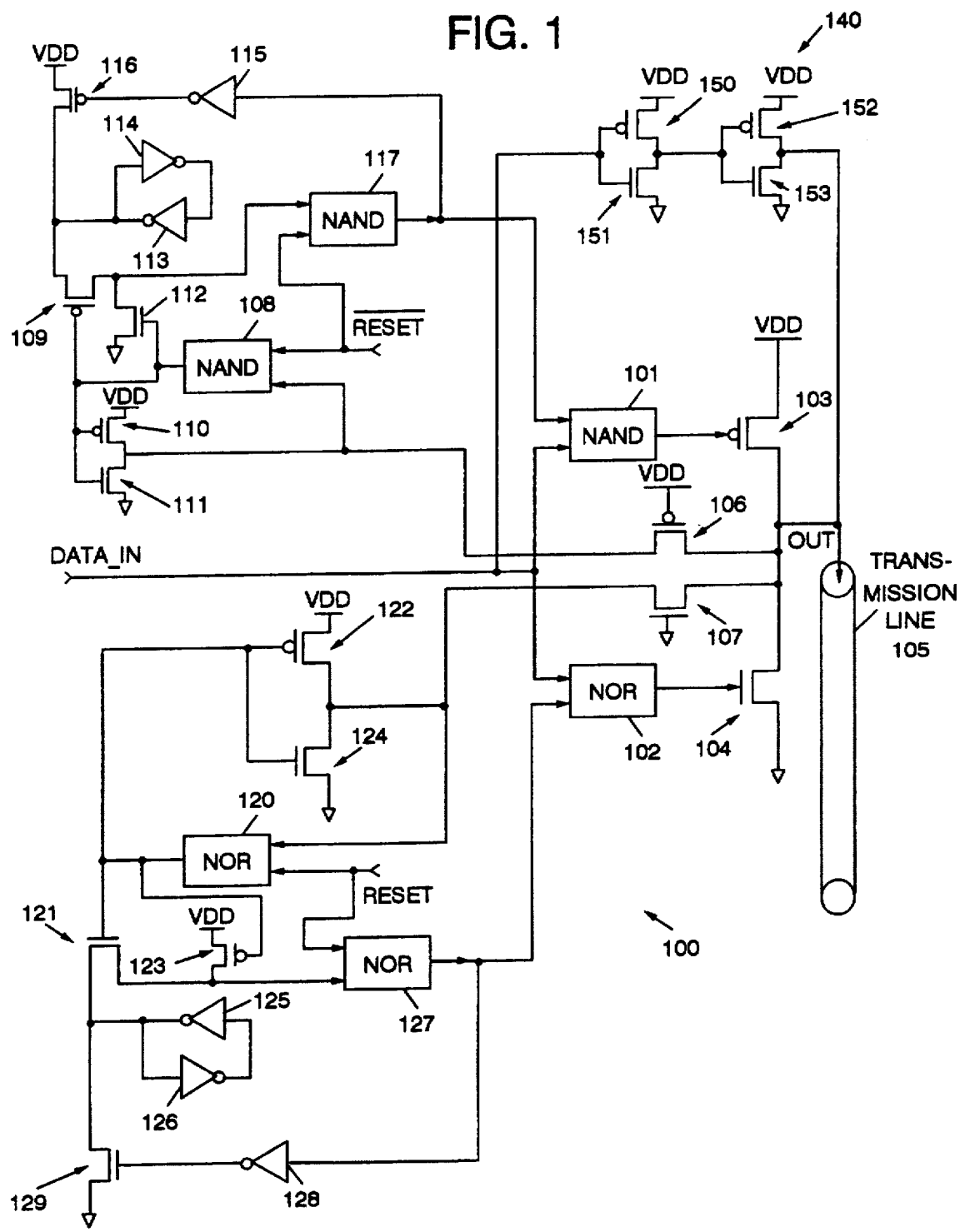

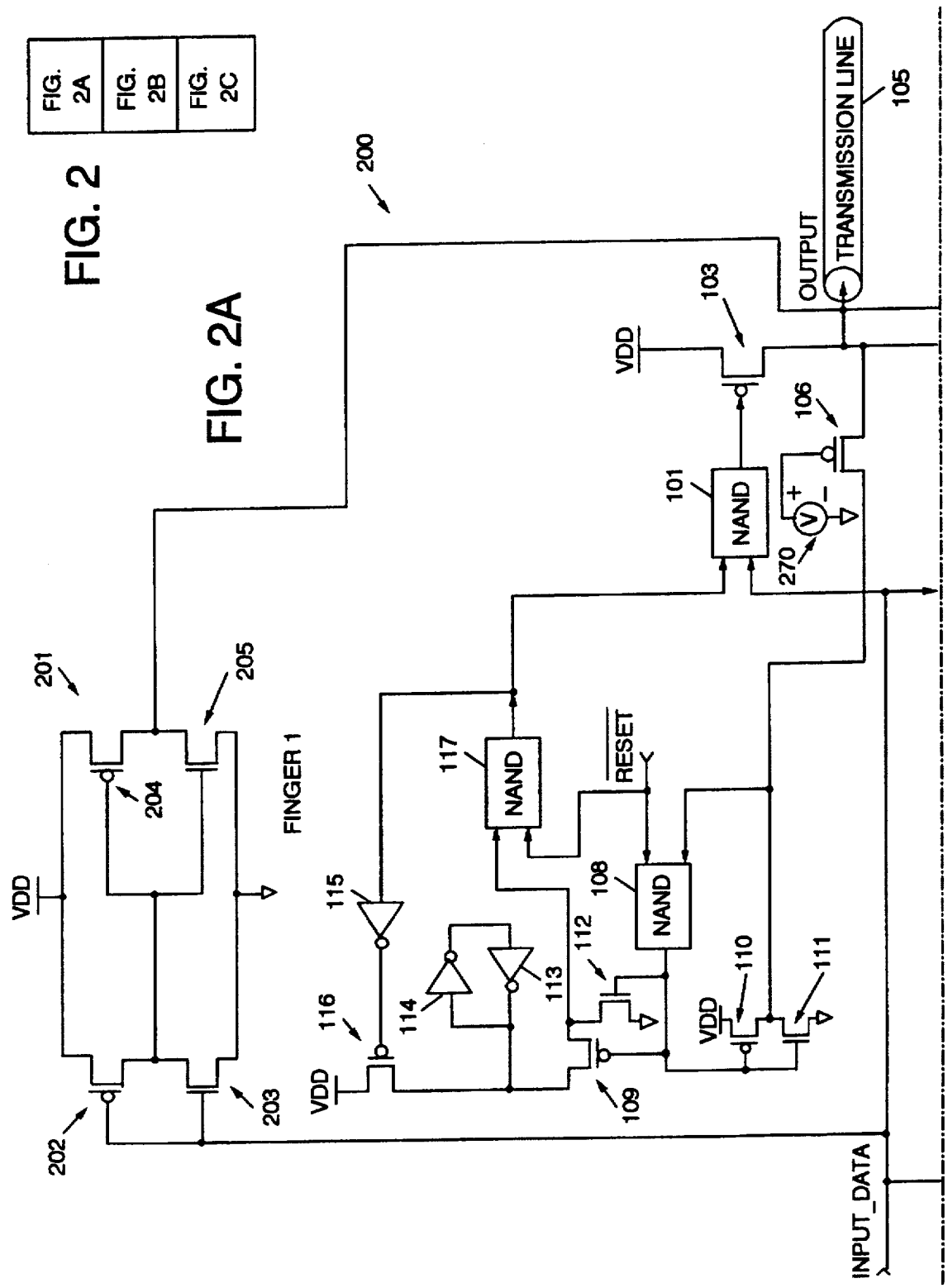

5,789,937

1
IMPEDENCE SELF-ADJUSTING DRIVER CIRCUIT

TECHNICAL FIELD

The present invention relates in general to driver circuits, and in particular, to an off-chip driver circuit operable for dynamically matching the impedance of a load.

BACKGROUND INFORMATION

Computers and other electronic devices are typically designed and configured using a plurality of integrated circuits ("chips"), with interconnecting transmission lines, or bus lines, providing communication capabilities between the various chips. When a signal is to be sent from one chip to another, or to any type of load, the data signal is received and then retransmitted by a driver circuit located on the chip near an output pin. The transmission line being driven has an impedance. It is well-known that an off-chip driver circuit should be designed with a source impedance to match the characteristic impedance of the transmission line it is expected to drive. This allows the system to utilize source terminated networks, thus avoiding the electrical penalty associated with far-end termination to a supply voltage (VDD) or ground (GND) or both.

The problem is that the chip designer does not know what package and network impedance on the transmission line will be used at the time of the chip design. To redesign and re-release the chip for another package at a later time is financially prohibited. However, if the transmission line is not properly terminated, ringing may result during the transmission of data signals on a transmission line, which may result in transmission errors.

Therefore, what is needed in the art is a driver circuit capable of dynamically matching the source impedance of the driver circuit to the impedance of the transmission medium which the driver circuit drives.

SUMMARY OF THE INVENTION

The foregoing need is satisfied by the present invention, which provides an off-chip driver circuit that senses the output signal on the transmission line and dynamically adjusts the output impedance of the driver circuit to match the impedance of the transmission line coupled to the output of the driver circuit. More specifically, the driver circuit includes circuitry for sensing an overshoot or an undershoot of the output signal outside of the voltage range defined by the reference voltage supplies coupled to the driver circuit. If such an undershoot or an overshoot is sensed, then a compensation circuit will turn off the portion of the driver circuit causing the overshoot or undershoot.

In one embodiment of the present invention, the driver circuit is comprised of a multitude of many off-chip driver circuits configured in parallel between the input to driver circuit and the output of the driver circuit to the transmission line. Each of these off-chip driver circuits is referred to as a "finger." Each finger operates independently to sense the output signal and provide the above compensation of the output impedance of the driver circuit.

The concept of the present invention is based on the principle that the off-chip transmitted signal from the driver circuit will ring with reflections on the transmission medium if it is not properly terminated, meaning that the driver source impedance should equal the characteristic impedance of the transmission medium. It is an objective of the present invention to eliminate or substantially reduce this undesirable ringing.

2

The driver circuit may be implemented within any one of the portions of a data processing system, such as for outputting signals from a processor onto a system bus.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWING

For a more complete understanding of the present invention, and the advantages thereof, reference is now made to the following descriptions taken in conjunction with the accompanying drawings, in which:

FIG. 1 illustrates an embodiment of the driver circuit of the present invention;

FIGS. 2 and 2A–2C illustrate an alternative embodiment of the driver circuit of the present invention;

DETAILED DESCRIPTION

Figure 2B:
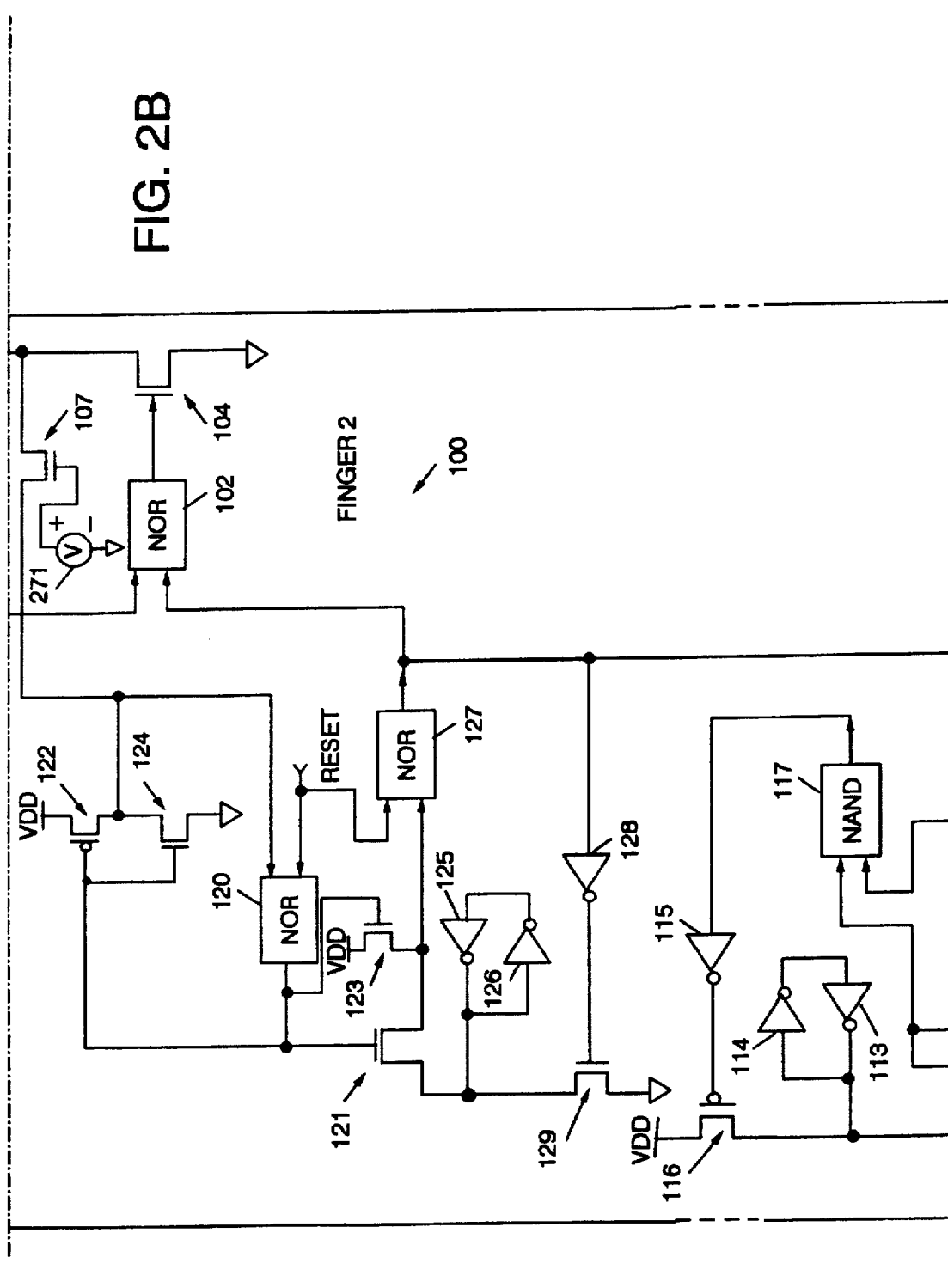

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Within this disclosure, the term "ringing" means an overshoot on a positive-going transition of the output signal exceeding the VDD positive supply voltage, which is also usually the final DC level of a typical CMOS (complementary metal oxide semiconductor) push-pull off-chip-driver circuit. "Ringing" also means the undershoot of "ground" (GND) for a negative-going output signal from the driver circuit. The present invention solves the ringing problem for both an undershoot and an overshoot independently.

Overshoot/undershoot of an output signal occurs when driver impedance is smaller than transmission line impedance. There are two typical transmission line impedances: Approximately 50 ohms and approximately 75 ohms. Typically, the impedance of a multiple-chip module ("MCM") is from 40–50 ohms, while the impedance of a card/board on which a single-chip module ("SCM") is placed is from 75–90 ohms. It is desirable to design a chip that can work on both MCM and SCM to save costs.

Referring to FIG. 1, there is illustrated driver circuit 100, which senses its own output signal and takes corrective feedback action to adjust the output impedance of driver circuit 100 to eliminate ringing.

An input data signal (Data_In) is received by driver circuit 140, which is comprised of two inverter circuits placed in series with each other. The first inverter is comprised of P-channel field effect transistor ("PFET") 150 and N-channel field effect transistor ("NFET") 151. The second inverter is comprised of PFET 152 and NFET 153. The output of driver circuit 140 is coupled to transmission line 105. Driver circuit 140 is always on to drive the received Data_In and drive that signal onto transmission line 105.

Data_In is also received by driver circuit 100 into one of the inputs of NAND circuit 101, and one of the inputs to NOR circuit 102. As will be further described below, driver circuit 100, which operates in parallel with driver circuit 140, compensates the output impedance provided to line 105 to match the impedance of transmission line 105. When driver circuit 100 senses an overshoot or an undershoot, the output impedance of driver circuit 100 is compensated.

The output of NAND circuit 101 is coupled to the gate electrode of PFET 103, which has its source electrode coupled to a first voltage supply VDD and its drain electrode coupled to the output of driver circuit 100.

The output of NOR circuit 102 is coupled to the gate electrode of NFET 104, which has its source electrode coupled to a second voltage supply, which in this case is ground (GND), and its drain electrode coupled to the output of circuit 100. The output of circuit 100 is coupled to transmission line 105, which may be a transmission line coupled to an output pin of a chip implementing driver circuit 100. Transmission line 105 may be a line within a bus, such as a system bus (see FIG. 3). Transmission line 105 has a characteristic impedance, which may vary with the particular type of circuit the chip implementing circuit 100 is coupled to. Furthermore, the characteristic impedance of transmission line 105 may also change during operation of the chip implementing circuit 100 in a dynamic fashion.

PFET 106, which has its gate electrode coupled to VDD and its source electrode coupled to transmission line 105 senses the rising transition in the output signal on transmission line 105.

NFET 107, which has its gate electrode coupled to GND and its source electrode coupled to transmission line 105 senses a falling transition in the output signal on transmission line 105.

The drain electrode of PFET 106 is coupled to one of the inputs to NAND circuit 108. The output of NAND circuit 108 is coupled to the gate electrode of PFET 109.

If the positive transition of the output signal on transmission line 105 exceeds VDD (an overshoot), this is "detected" and fed to NAND circuit 108 by PFET 106 turning on.

During normal operation, driver circuit 100 operates to receive the Data_In signal and drive that signal using PFET 103 and NFET 104 onto transmission line 105. In such a case, NAND circuit 101 and NOR circuit 102 operate as inverters to provide the same amount of gate delay as the inverter comprising PFET 150 and NFET 151. The gate delay inserted by devices 152 and 153 is matched by the gate delays provided by devices 103 and 104.

The Reset signal provided to the input to NOR circuit 120 is normally an active low signal, with its inverse, or complement (indicated in the drawings as "Reset" with a bar thereover), an active high signal. Hereinafter, the complement of the Reset signal will be indicated as Reset*. This active high signal is provided to NAND circuit 108 and to one of the inputs to NAND circuit 117. The other input to NAND circuit 108 floats during normal operation of driver circuit 100. Since PFET device 106 is off, it is likely that this input to NAND circuit 108 will be a 0, because due to leakage current, the average time the on-chip capacitance can hold a 1 is approximately one millisecond. This will cause the output of NAND circuit 108 to be a 1, thus turning on NFET 112. This will drive the second input into NAND circuit 117 to a 0, causing the output of NAND circuit 117 to be a 1, which is supplied to one of the inputs to NAND circuit 101 causing NAND circuit 101 to act as an inverter during normal operation.

The 1 output from NAND circuit 108 is inverted by the inverter comprised of PFET 110 and NFET 111, which outputs a 0 into the second input of NAND circuit 108. The inverter circuit comprised of devices 110 and 111 acts as a keeper device. This circuit is also defined to be a weak device, so that it will not sink a lot of current and will be easily overcome by the overshoot signal passed by PFET 106 when such an overshoot occurs, so that this overshoot signal is provided to the second input of NAND circuit 108.

The 1 output from NAND circuit 117 is inverted by inverter 115 resulting in a 0 signal being provided to PFET 116, turning on PFET 116. This provides a 1 signal to the latch circuit comprised of inverters 113 and 114.

During normal operation, the output of NOR circuit 120 is a 0, which is inverted by the inverter comprised of PFET 122 and NFET 124 into a 1. This maintains the output of NOR circuit 120 at a 0 turning on PFET 123, thus causing one of the inputs to NOR circuit 127 to be a 1, which causes the output of NOR circuit 127 to always be a 0. This 0 is provided to one of the inputs to NOR circuit 102 causing NOR circuit 102 to act as an inverter during normal operation of driver circuit 100.

The Reset signal and its complement are used to latch a 0 and a 1 into the inputs of NAND circuit 108 and NOR circuit 120, respectfully. When the chip is powered on, it goes through an impedance adjustment process. The Reset signal is turned on initially. This keeps all of the Fingers in driver circuit 100 turned on. With all the Fingers turned on, the impedance of driver circuit 100 is at its minimal amount. This is also in preparation for an overshoot/undershoot condition should the impedance of driver circuit 100 not match that of transmission line 105. A 0 is latched into one of the inputs of NAND circuit 108 while PFET 106 is off; similarly, a 1 is latched into one of the inputs of NOR circuit 120 while NFET 107 is off. The next step is to turn off the Reset signal (Reset=0). Because of the latched 0 in NAND circuit 108 and the latched 1 in NOR circuit 120, when the Reset signal is turned off, the voltage at all nodes in driver circuit 100 remain unchanged.

If there is no overshoot/undershoot condition (i.e., the impedance of driver circuit 100 substantially matches that of transmission line 105), all the driver Fingers are in a normal usage. They are held in this normal usage state indefinitely because of the 0 latched into NAND circuit 108 and the 1 latched into NOR circuit 120. A small amount of on-chip noise (absolute value of approximately 300–400 millivolts) coupled into one of the inputs of NAND circuit 108 and one of the inputs of NOR circuit 120 will not turn off by accident the driver Finger that consists of PFET 103 and NFET 104. The on-chip noise may be caused by the coupling of many adjacent metal lines into these two nodes.

If there is an overshoot/undershoot condition (i.e., the impedance of driver circuit 100 does not substantially match that of transmission line 105), PFET 106 and NFET 107 will be turned on, and through the process of driver circuit 100, the Finger that consists of PFET 103 and NFET 104 will be turned off indefinitely. At this time a 1 should be latched into one of the inputs of NAND circuit 108 and a 0 should be latched into one of the inputs of NOR circuit 120. After the turning off of the Finger, the overshoot/undershoot condition should not occur because of the matching impedance. PFET 106 and NFET 107 should not be turned on. However, even a small amount of on-chip noise coupled into one of the inputs of NAND circuit 108 and one of the inputs of NOR circuit 120 will not turn on by accident the driver Finger that consists of PFET 103 and NFET 104.

The 0 output from NOR 127 is inverted by inverter 128 to a 1, which turns on NFET 129, thus latching a 0 into the latch comprised of inverters 125 and 126. This may all be caused by the Reset signal going to an active high. When the Reset signal is removed, a 0 is provided to that input into NOR circuit 120.

Upon receipt of an overshoot on the output signal on transmission line 105 above the voltage VDD, device 106 turns on resulting in a 1 signal being provided to one of the inputs to NAND circuit 108. Since the Reset signal is not active, Reset* is a 1. As a result, the output of NAND circuit 108 becomes a 0 turning off NFET 112. This 0 is inverted to a 1 by the inverter circuit comprised of devices 110 and 111 to maintain the output of NAND circuit 108. This 0 output from NAND circuit 108 turns on PFET 109, which supplies the 1 stored within the latch circuit comprised of devices 113 and 114 to one of the inputs to NAND circuit 117. Since the other input to NAND circuit 117 is the inactive Reset circuit, Reset*, which is a 1, the output of NAND circuit 117 becomes a 0 supplied to one of the inputs to NAND circuit 101. This causes the output of NAND circuit 101 to become a 1 turning off PFET 103, which increases the output impedance of driver circuit 100 resulting in a decrease of the sensed overshoot.

When driver circuit 100 senses an undershoot of GND on transmission line 105, NFET 107 turns on providing a 0 into one of the inputs to NOR circuit 120.

Since the Reset signal is inactive, the output of NOR circuit 120 is a 1, which turns off PFET 123. This 1 is inverted by the inverter comprised of devices 122 and 124, thus maintaining the 1 output from NOR circuit 120. Additionally, this 1 output from NOR circuit 120 turns on NFET 121, which supplies the 0 stored within the latch comprised of devices 125 and 126 to one of the inputs to NOR circuit 127. The two 0 inputs into NOR circuit 127 causes its output to become a 1, which is supplied to one of the inputs to NOR circuit 102. This causes the output of NOR circuit 102 to be a 0 turning off NFET 104, and thereby increasing the output impedance and decreasing the undershoot on transmission line 105.

Driver circuit 100 is designed with two Fingers. As noted above, Finger 140 is always on. With both Fingers on, the impedance of driver circuit 100 may be equivalent of that of an MCM. With only Finger 140 on, the driver impedance may be equivalent to that of an SCM.

If a chip with driver circuit 100 is placed on an MCM, the driver impedance may not change. If a chip with driver circuit 100 is put on a card/board, the driver impedance adjusts itself by turning off one Finger.

Figure 2C:
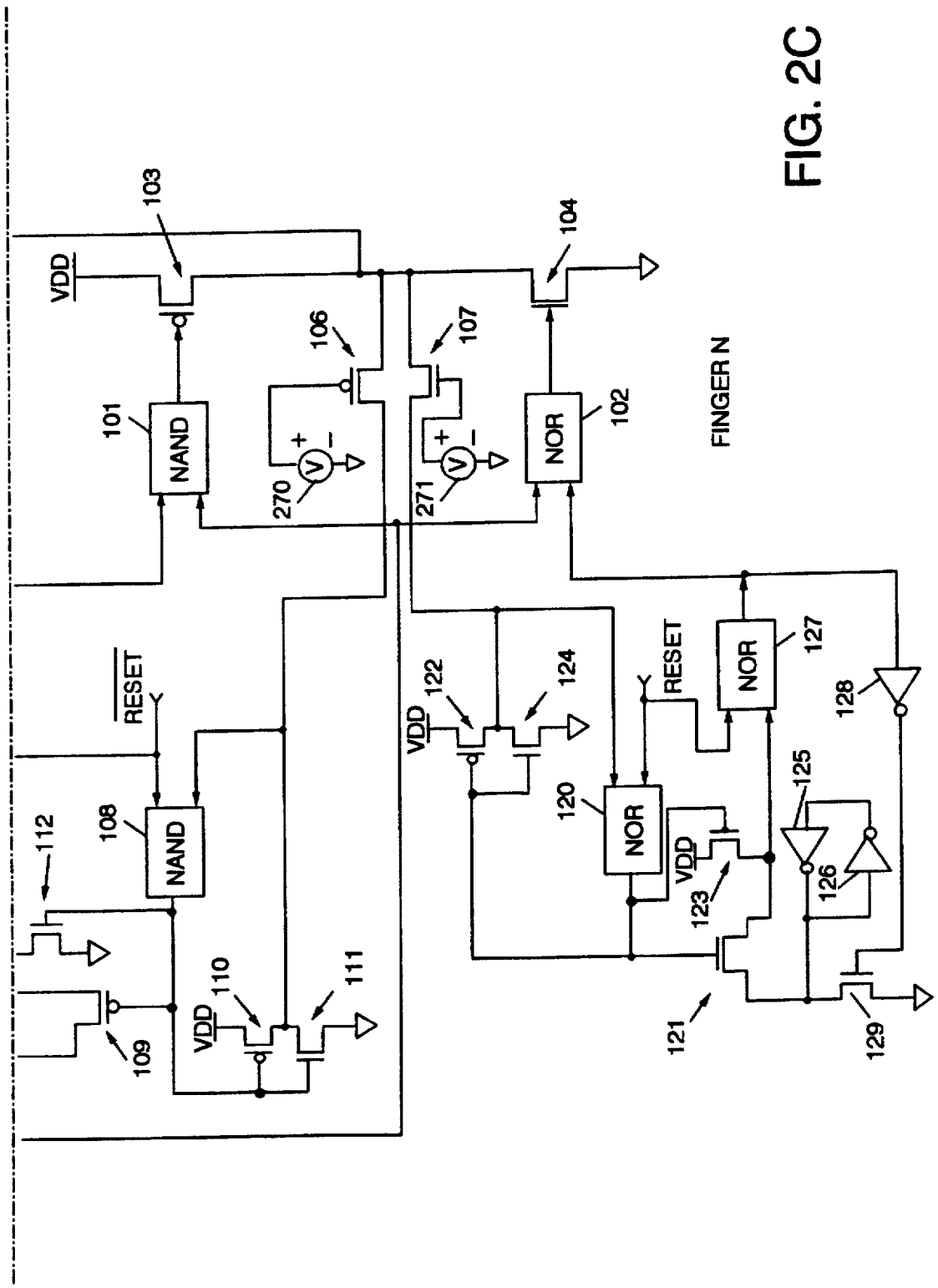

Referring next to FIG. 2, which is illustrated within FIGS. 2A, 2B and 2C, an alternative embodiment of the present invention is depicted. Finger 1 is comprised of a typical driver circuit 201 similar to driver circuit 140 illustrated in FIG. 1. Driver circuit 201 is comprised of PFETs 202 and 204 and NFETs 203 and 205. Driver circuit 201 is always on receiving Input_Data and outputting this data onto transmission line 105.

Driver circuit 100 is repeated within Fingers 2 ... N. Each of Fingers 2 ... N operate in a manner similar to driver circuit 100 to compensate for sensed overshoot and undershoot on the output signal on transmission line 105. The number N may be modified as desired.

Each of Fingers 2 ... N, as noted above, is similar to driver circuit 100, except that devices 106 and 107 are coupled to voltage sources 270 and 271 instead of VDD and GND. Furthermore, the value for voltage source 270 within each of Fingers 2 ... N may be different. In other words the voltage supplied by voltage source 270 within Finger 2 may be lesser or greater than the voltage supplied by voltage source 270 within Finger N. Likewise, voltage source 271 within Finger 2 may be different (lesser or greater) than the voltage supplied by voltage source 271 within Finger N. The result is that each of Fingers 2 ... N may be designed to sense differing levels of undershoot and/or overshoot to thereby insert additional output impedance in a stepwise manner.

For example, voltage sources 270 and 271 within each of Fingers 2 ... N may be set so that Finger 2 senses an overshoot that is 1 volt over VDD, while Finger N may sense an overshoot that is 2 volts over VDD. The result is that Finger 2 will turn off before Finger N. As the overshoot increases, and as more of Fingers 2 ... N are turned off, the output impedance of driver circuit 200 is increased to further compensate for the sensed overshoot on transmission line 105.

The same is true for the sensing of undershoot on transmission line 105.

Figure 3:
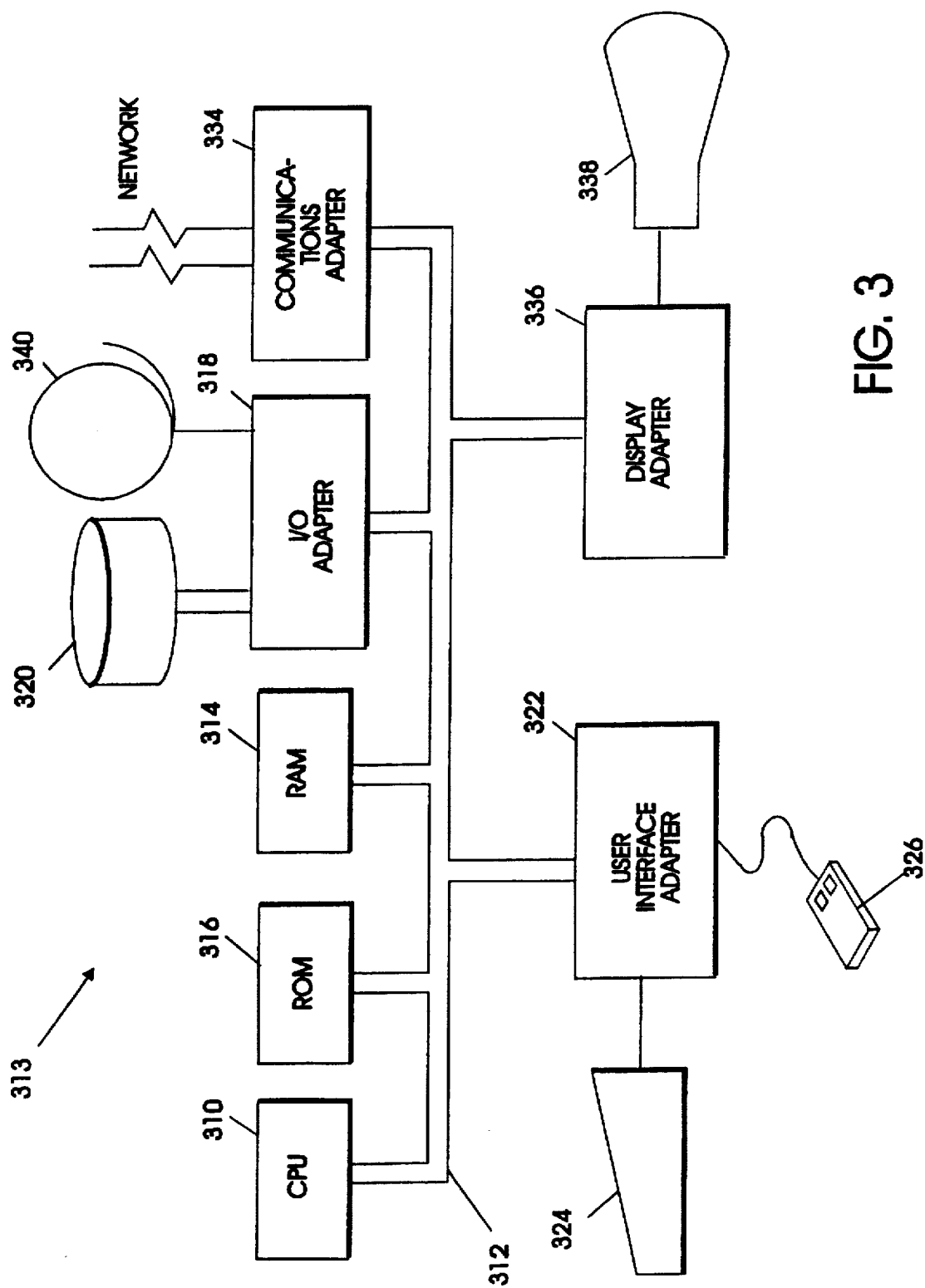
FIG. 3 illustrates a data processing system implementing the present invention.

A representative hardware environment for practicing the present invention is depicted in FIG. 3, which illustrates a typical hardware configuration of workstation 313 in accordance with the subject invention having central processing unit (CPU) 310, such as a conventional microprocessor, and a number of other units interconnected via system bus 312. Workstation 313 includes random access memory (RAM) 314, read only memory (ROM) 316, and input/output (I/O) adapter 318 for connecting peripheral devices such as disk units 320 and tape drives 340 to bus 312, user interface adapter 322 for connecting keyboard 324, mouse 326, and/or other user interface devices such as a touch screen device (not shown) to bus 312, communication adapter 334 for connecting workstation 313 to a data processing network, and display adapter 336 for connecting bus 312 to display device 338. CPU 310 may include other circuitry not shown herein, which will include circuitry commonly found within a microprocessor, e.g., execution unit, bus interface unit, arithmetic logic unit, etc. CPU 310 may also reside on a single integrated circuit.

Either of the driver circuits described above with respect to FIGS. 1 and 2 could be used within any of the bus devices shown in FIG. 3 (CPU 310, ROM 316, RAM 314, I/O adapter 318, communications adapter 334, user interface adapter 322, and display adapter 336) in order to drive signals onto bus 312.

Figure 4:
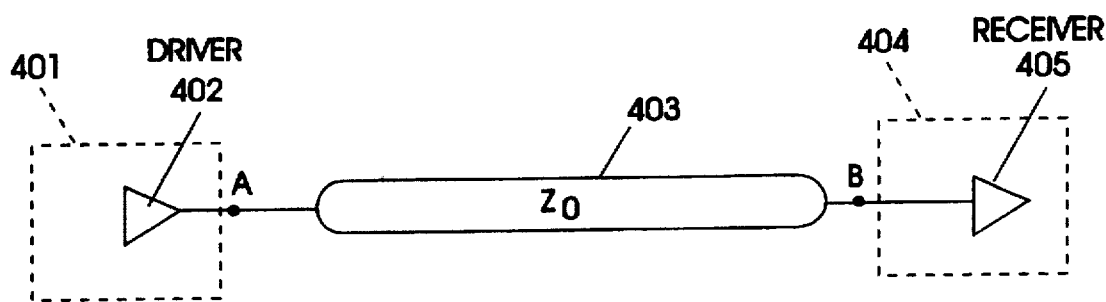
FIG. 4 illustrates a transmission line between two integrated circuits.

Referring to FIG. 4, there is illustrated transmission line 403 coupled to chip 401 having driver circuit 402 at node A (labeled as "NA"), and coupled to chip 404, which includes receiver 405, at node B (labeled as "NB"). In the following discussion, the near end voltage shall refer to the voltage at node A, while the far end voltage shall refer to the voltage at node B. Tau ("τ") shall refer to the "time of flight" (the amount of time required for a signal to travel from node A to node B).

The following discussion presents an example of a calculation of the magnitude of overshoot/undershoot. The voltage at node A changes with time, it will be assumed that the cycle time of a transmitted signal is longer than tau. The following example is presented for an overshoot case. The result for the undershoot case can be obtained by a similar calculation.

A general review of near end voltage Vne at node A is given, followed by a numerical example.

I) General Review

1) Initial near-end voltage

When the off-chip driver 402 sends a logic "1" on transmission line 403, the near-end voltage at node A is given by:

$$Vne = \{Zo/(Rp+Zo)\}*Vdd$$

where

Zo=transmission line impedance
Rp=driver impedance for pull-up device (PFET)
Vdd=power supply It is observed that when Rp<Zo, Vne>0.5 Vdd.

2) At one time the time of flight

When Vne arrives at the far-end, with no termination, and hence with reflection coefficient rho_ne=1, the incoming wave V+ is totally reflected back, known as reflected wave V−.

The far-end voltage Vfe at node B is the sum of incoming wave V+ and reflected wave V−:

$$\begin{aligned} Vfe &= V+ + V- \\ &= \{Zo/(Rp+Zo)\}*Vdd + \{Zo/(Rp+Zo)\}*Vdd \\ &= 2*\{Zo/(Rp+Zo)\}*Vdd \end{aligned}$$

3) At two times the time of flight

The reflected V− travels back to the near end. At the near end V− is added to the voltage Vne still being sent out by driver 402. However, the reflection coefficient at the near end is negative because Rp<Zo:

$$rho\_ne = (Rp-Zo)/(Rp+Zo)$$

The voltage at the near end Vne now is the sum of three mentioned voltages. The voltage at the near end at t=2 taus shall be Vne_2tau:

$$\begin{aligned} Vne\_2tau &= Vne + V- + rho\_ne*V- \\ &= 2*\{Zo/(Rp+Zo)\}*Vdd + \\ &\quad \{(Rp-Zo)/(Rp+Zo)\} * \{(Zo/(Rp+Zo)\}*Vdd \end{aligned}$$

4) At three times the time of flight

The negative reflected voltage rho_ne*V− goes from the near end at node A to the far end at node B. At the far end it is totally reflected back again.

5) At four times the time of flight

When the negative reflected voltage rho_ne*V− returns to the near end at node A, it is again negatively reflected back and hence becomes positive. The amount of the reflected voltage at the near end at t=4 taus shall be Vrf_4tau.

$$\begin{aligned} Vrf\_4tau &= rho\_ne * (rho\_ne*V-) \\ &= (rho\_ne**2)*V- \end{aligned}$$

The voltage at the near end at t=4 taus shall be Vne_4tau. This is the voltage relied on to create the overshoot.

$$\begin{aligned} Vne\_4tau &= Vne\_2tau + Vrf\_4tau \\ &= 2*\{Zo/(Rp+Zo)\}*Vdd + \\ &\quad \{(Rp-Zo)/(Rp+Zo)\} * \{(Zo/(Rp+Zo)\}*Vdd + \\ &\quad (rho\_ne**2)*V- \end{aligned}$$

II) Numerical Example

Assume that initially Rp=40 ohms

Zo=80 ohms

1) Initial near-end voltage $$\begin{aligned} Vne &= \{Zo/(Rp+Zo)\} * Vdd \\ &= \{80/(40+80)\} * Vdd \\ &= 2/3 * Vdd \end{aligned}$$

2) At one time the time of flight

Initial far-end voltage:

$$\begin{aligned} Vfe &= 2*\{Zo/(Rp+Zo)\} * Vdd \\ &= 2 * (2/3 * Vdd) \\ &= 4/3 * Vdd \end{aligned}$$

3) At two times the time of flight

The reflection coefficient at the near end is:

$$\begin{aligned} rho\_ne &= (Rp-Zo)/(Rp+Zo) \\ &= (40-80)/(40+80) \\ &= -1/3 \end{aligned}$$

The near end voltage is $$\begin{aligned} Vne\_2tau &= Vne + V- + rho\_ne*V- \\ &= 2*\{Zo/(Rp+Zo)\}*Vdd + \\ &\quad \{(Rp-Zo)/(Rp+Zo)\} * \{(Zo/(Rp+Zo)\}*Vdd \\ &= 4/3 Vdd - (1/3 * 2/3 * Vdd) \\ &= 10/9 Vdd \end{aligned}$$

with Vdd=3.6 V, Vne_2tau=10/9*3.6 V=4 V, the overshoot is 4V−3.6 V=0.4 V.

with Vdd=2.5 V, Vne_2tau=10/9*2.5 V=2.77 V, the overshoot is 2.77 V−2.5 V=0.27 V.

Depending on the threshold of PFET used, the above overshoot voltage may or may not turn on the PFET.

If it does not have enough voltage to turn on the PFET, the near end voltage at 4 taus is relied on to turn it on, as shown below.

9

4) At four times the time of flight $$\begin{aligned}
Vne\_4tau &= Vne\_2tau + Vrf\_4tau \\
&= 2*\{Zo/(Rp+Zo)\}*Vdd + \\
&\quad \{(Rp-Zo)/(Rp+Zo)\} * \{(Zo/(Rp+Zo)\}*Vdd + \\
&\quad (rho\_ne**2)*V- \\
&= 10/9Vdd +_*\{(-1/3)**2\} * 2/3Vdd! \\
&= 10/9Vdd + 2/27Vdd \\
&= 32/27Vdd
\end{aligned}$$

with Vdd=3.6 V, Vne_4tau=32/27*3.6 V=4.267 V, the overshoot is 4.267 V−3.6 V=0.667 V.

with Vdd=2.5 V, Vne_4tau=32/27*2.5 V=2.963 V, the overshoot is 2.963 V−2.5 V=0.463 V.

Important Points:

In order to guarantee switching of PFET 106, a low threshold PFET device should be used.

During the impedance adjustment process, the cycle time should be longer than 5 taus to allow second reflection to take effect.

Figure 5:
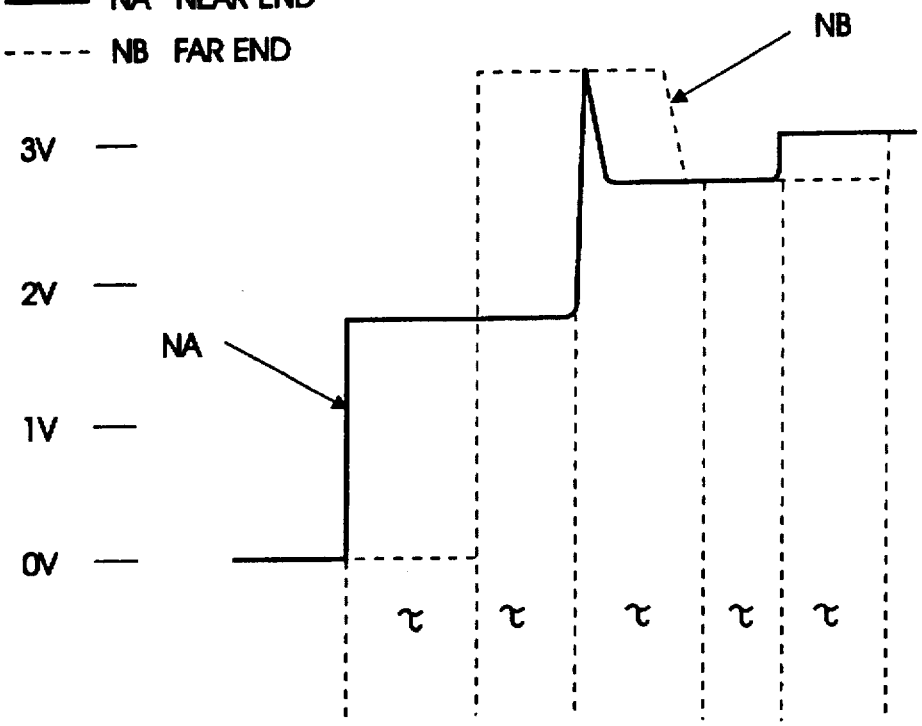
FIG. 5 illustrates examples of waveforms at the near end and the far end integrated circuits coupled by a transmission line.

Example waveforms representing the above are illustrated in FIG. 5.

Although the present invention and its advantages have been described in detail, it should be understood that various changes, substitutions and alterations can be made herein without departing from the spirit and scope of the invention as defined by the appended claims.

What is claimed is:

1. A driver circuit comprising:
    circuitry operable for outputting an output signal on a transmission line, wherein said transmission line has an unknown impedance;
    circuitry operable for sensing said output signal; and
    circuitry operable for dynamically compensating an output impedance of said driver circuit in response to said sensing of said output signal so that said output signal has a magnitude substantially within a predetermined boundary, wherein said sensing circuitry comprises circuitry for sensing an overshoot of said output signal exceeding a predetermined voltage level, wherein said compensating circuitry comprises circuitry for increasing said output impedance of said driver circuit in response to said sensing of said overshoot of said output signal exceeding said predetermined voltage level, wherein said outputting circuitry comprises a first PFET coupled between a first voltage supply and said transmission line, and wherein said increasing circuitry comprises circuitry for switching off said first PFET, wherein said first voltage supply determines said predetermined voltage level, wherein said sensing circuitry comprises a second PFET, wherein a gate electrode of said second PFET is coupled to said first voltage supply and a source electrode of said second PFET is coupled to said transmission line, and wherein said switching off circuitry comprises a NAND circuit having an input coupled to a drain electrode of said second PFET, wherein an output of said NAND circuit is coupled to a gate electrode of said first PFET.

2. A driver circuit comprising:
    circuitry operable for outputting an output signal on a transmission line, wherein said transmission line has an unknown impedance;
    circuitry operable for sensing said output signal; and
    circuitry operable for dynamically compensating an output impedance of said driver circuit in response to said

10 sensing of said output signal so that said output signal has a magnitude substantially within a predetermined boundary, wherein said sensing circuitry comprises circuitry for sensing an undershoot of said output signal below a predetermined voltage level, wherein said compensating circuitry comprises circuitry for decreasing said output impedance of said driver circuit in response to said sensing of said undershoot of said output signal below said predetermined voltage level, wherein said outputting circuitry comprises a first NFET coupled between a first voltage supply and said transmission line, and wherein said decreasing circuitry comprises circuitry for switching off said first NFET, wherein said first voltage supply determines said predetermined voltage level, wherein said sensing circuitry comprises a second NFET, wherein a gate electrode of said second NFET is coupled to said first voltage supply and a source electrode of said second NFET is coupled to said transmission line, and wherein said switching off circuitry comprises a NOR circuit having an input coupled to a drain electrode of said second NFET, wherein an output of said NOR circuit is coupled to a gate electrode of said first NFET.

3. A driver circuit comprising:
    circuitry operable for outputting an output signal on a transmission line, wherein said transmission line has an unknown impedance;
    circuitry operable for sensing said output signal;
    circuitry operable for dynamically compensating an output impedance of said driver circuit in response to said sensing of said output signal so that said output signal has a magnitude substantially within a predetermined boundary;
    second circuitry operable for outputting said output signal on said transmission line;
    second circuitry operable for sensing said output signal, wherein said second sensing circuitry operates independently from said first mentioned sensing circuitry; and
    second circuitry operable for dynamically compensating said output impedance of said driver circuit in response to said sensing of said output signal so that said output signal has said magnitude substantially within said predetermined boundary, wherein said second compensating circuitry operates independently from said first mentioned compensating circuitry.

4. An integrated circuit operable for producing a data signal to be output by a driver circuit via a bus line coupled to said driver circuit, wherein said bus line has an unknown impedance, said driver circuit comprising:
    circuitry operable for receiving said data signal;
    first circuitry, coupled to said receiving circuitry, operable for outputting said data signal onto said bus line;
    first circuitry operable for sensing said data signal on said bus line; and
    first circuitry operable for compensating an output impedance of said driver circuit in response to said sensing of said data signal so that said data signal on said bus line has a magnitude substantially within a first predetermined boundary, wherein said first circuitry operable for compensating operates during normal operation of said driver circuit when said driver circuit is driving real data, wherein said first sensing circuitry comprises:
        first circuitry operable for sensing an overshoot of said data signal exceeding a first predetermined voltage level; and second circuitry operable for sensing an undershoot of said data signal below a second predetermined voltage level.

5. The driver circuit as recited in claim 4, wherein said first compensating circuitry comprises:
   circuitry operable for increasing said output impedance of said driver circuit in response to said sensing of said overshoot of said data signal exceeding said first predetermined voltage level; and
   circuitry operable for decreasing said output impedance of said driver circuit in response to said sensing of said undershoot of said data signal below said second predetermined voltage level.

6. The driver circuit as recited in claim 5, wherein said first outputting circuitry comprises:
   a first PFET coupled between a first voltage supply and said bus line, and wherein said increasing circuitry includes first circuitry operable for switching off said first PFET, wherein said first voltage supply determines said first predetermined voltage level; and
   a first NFET coupled between a second voltage supply and said bus line, and wherein said decreasing circuitry includes second circuitry operable for switching off said first NFET, wherein said second voltage supply determines said second predetermined voltage level.

7. An integrated circuit operable for producing a data signal to be output by a driver circuit via a bus line coupled to said driver circuit, wherein said bus line has an unknown impedance, said driver circuit comprising:
   circuitry operable for receiving said data signal;
   first circuitry, coupled to said receiving circuitry, operable for outputting said data signal onto said bus line;
   first circuitry operable for sensing said data signal on said bus line; and
   first circuitry operable for compensating an output impedance of said driver circuit in response to said sensing of said data signal so that said data signal on said bus line has a magnitude substantially within a first predetermined boundary, wherein said first sensing circuitry comprises:
      first circuitry operable for sensing an overshoot of said data signal exceeding a first predetermined voltage level; and
   second circuitry operable for sensing an undershoot of said data signal below a second predetermined voltage level, wherein said first compensating circuitry comprises:
      circuitry operable for increasing said output impedance of said driver circuit in response to said sensing of said overshoot of said data signal exceeding said first predetermined voltage level; and
      circuitry operable for decreasing said output impedance of said driver circuit in response to said sensing of said undershoot of said data signal below said second predetermined voltage level, wherein said first outputting circuitry comprises:
         a first PFET coupled between a first voltage supply and said bus line, and wherein said increasing circuitry includes first circuitry operable for switching off said first PFET, wherein said first voltage supply determines said first predetermined voltage level; and
         a first NFET coupled between a second voltage supply and said bus line, and wherein said decreasing circuitry includes second circuitry operable for switching off said first NFET,
   wherein said second voltage supply determines said second predetermined voltage level;
   a second PFET, wherein a gate electrode of said second PFET is coupled to said first voltage supply and a source electrode of said second PFET is coupled to said bus line, and wherein said first switching off circuitry includes a NAND circuit having an input coupled to a drain electrode of said second PFET, wherein an output of said NAND circuit is coupled to a gate electrode of said first PFET; and
   a second NFET, wherein a gate electrode of said second NFET is coupled to said second voltage supply and a source electrode of said second NFET is coupled to said bus line, and wherein said second switching off circuitry includes a NOR circuit having an input coupled to a drain electrode of said second NFET, wherein an output of said NOR circuit is coupled to a gate electrode of said first NFET.

8. An integrated circuit operable for producing a data signal to be output by a driver circuit via a bus line coupled to said driver circuit, wherein said bus line has an unknown impedance, said driver circuit comprising:
   circuitry operable for receiving said data signal;
   first circuitry, coupled to said receiving circuitry, operable for outputting said data signal onto said bus line;
   first circuitry operable for sensing said data signal on said bus line;
   first circuitry operable for compensating an output impedance of said driver circuit in response to said sensing of said data signal so that said data signal on said bus line has a magnitude substantially within a first predetermined boundary;
   second circuitry, coupled to said receiving circuitry, operable for outputting said data signal onto said bus line;
   second circuitry, coupled to said second outputting circuitry, operable for sensing said data signal, wherein said second sensing circuitry operates independently from said first sensing circuitry; and
   second circuitry, coupled to said second outputting circuitry, operable for compensating said output impedance of said driver circuit in response to said sensing of said data signal by said second sensing circuitry so that said data signal has a magnitude substantially within a second predetermined boundary, wherein said second compensating circuitry operates independently from said first compensating circuitry.

9. The driver circuit as recited in claim 8, further comprising:
   third circuitry, coupled to said receiving circuitry, operable for outputting said data signal onto said bus line, wherein said third outputting circuitry includes:
      a first inverter circuit coupled to said receiving circuitry; and
      a second inverter circuit, coupled to an output of said first inverter circuit, coupled to said bus line.

10. A driver circuit comprising:
   circuitry operable for receiving a data signal;
   a first finger comprising:
      first circuitry, coupled to said receiving circuitry, operable for outputting said data signal via a transmission line having an impedance;
      first circuitry operable for sensing said data signal on said transmission line; and
      first circuitry operable for compensating an output impedance of said first finger in response to said sensing of said data signal so that an output impedance of said driver circuit more closely matches said impedance of said transmission line; and a second finger comprising:
second circuitry, coupled to said receiving circuitry, operable for outputting said data signal onto said transmission line;
second circuitry, coupled to said second outputting circuitry, operable for sensing said data signal, wherein said second sensing circuitry operates independently from said first sensing circuitry; and
second circuitry, coupled to said second outputting circuitry, operable for compensating an output impedance of said second finger in response to said sensing of said data signal by said second sensing circuitry so that said output impedance of said driver circuit more closely matches said impedance of said transmission line, wherein said second compensating circuitry operates independently from said first compensating circuitry.

11. The driver circuit as recited in claim 10, wherein said first sensing circuitry comprises:
first circuitry operable for sensing an overshoot of said data signal exceeding a first predetermined voltage level; and
second circuitry operable for sensing an undershoot of said data signal below a second predetermined voltage level, and wherein said first compensating circuitry comprises:
circuitry operable for increasing said output impedance of said driver circuit in response to said sensing of said overshoot of said data signal exceeding said first predetermined voltage level; and
circuitry operable for decreasing said output impedance of said driver circuit in response to said sensing of said undershoot of said data signal below said second predetermined voltage level, wherein said second sensing circuitry comprises:
third circuitry operable for sensing an overshoot of said data signal exceeding a third predetermined voltage level; and
fourth circuitry operable for sensing an undershoot of said data signal below a fourth predetermined voltage level, and wherein said second compensating circuitry comprises:
circuitry operable for increasing said output impedance of said driver circuit in response to said sensing of said overshoot of said data signal exceeding said third predetermined voltage level; and
circuitry operable for decreasing said output impedance of said driver circuit in response to said sensing of said undershoot of said data signal below said fourth predetermined voltage level.

* * * * *